United States Patent
Kalva et al.

(10) Patent No.: US 11,079,434 B2
(45) Date of Patent: Aug. 3, 2021

(54) TEST SYSTEMS FOR EXECUTING SELF-TESTING IN DEPLOYED AUTOMOTIVE PLATFORMS

(71) Applicant: NVIDIA Corporation, San Jose, CA (US)

(72) Inventors: Anitha Kalva, San Jose, CA (US); Jue Wu, Los Gatos, CA (US)

(73) Assignee: NVIDIA Corporation, Santa Clara, CA (US)

( * ) Notice: Subject to any disclaimer, the term of this patent is extended or adjusted under 35 U.S.C. 154(b) by 74 days.

(21) Appl. No.: 16/598,558

(22) Filed: Oct. 10, 2019

(65) Prior Publication Data
US 2020/0116783 A1     Apr. 16, 2020

Related U.S. Application Data

(60) Provisional application No. 62/743,904, filed on Oct. 10, 2018.

(51) Int. Cl.
*G01R 31/3187*     (2006.01)
*G01R 31/3177*     (2006.01)
(Continued)

(52) U.S. Cl.
CPC ..... *G01R 31/3187* (2013.01); *G01R 31/3177* (2013.01); *G01R 31/31917* (2013.01);
(Continued)

(58) Field of Classification Search
CPC .......... G01R 31/3187; G01R 31/31917; G01R 31/3177; G11C 29/16; G11C 2029/2602; G06F 31/1668; G06Q 10/087
See application file for complete search history.

(56) References Cited

U.S. PATENT DOCUMENTS 6,115,763 A    9/2000  Douskey et al.
6,651,201 B1   11/2003 Adams et al.
(Continued)

OTHER PUBLICATIONS

R. Gibbins, R. D. Adams, T. Eckenrode, M. Ouellette and Yuejian Wu, "Design and test of a 9-port SRAM for a 100 GB/s STS-1 switch," Proceedings of the 2002 IEEE International Workshop on Memory Technology, Design and Testing (MTDT2002), Bendor, France, 2002, pp. 83-87. (Year: 2002).*
(Continued)

*Primary Examiner* — Cynthia Britt
(74) *Attorney, Agent, or Firm* — Shook, Hardy & Bacon, L.L.P.

(57) ABSTRACT

In various examples, a test system is provided for executing built-in-self-test (BIST) on integrated circuits deployed in the field. The integrated circuits may include a first device and a second device, the first device having direct access to external memory, which stores test data, and the second device having indirect access to the external memory by way of the first device. In addition to providing a mechanism to permit the first device and the second device to run test concurrently, the hardware and software may reduce memory requirements and runtime associated with running the test sequences, thereby making real-time BIST possible in deployment. Furthermore, some embodiments permit a single external memory image to cater to different SKU configurations.

22 Claims, 11 Drawing Sheets

(51) Int. Cl.
    *G06F 13/16*     (2006.01)
    *G06Q 10/08*     (2012.01)
    *G11C 29/16*     (2006.01)
    *G01R 31/319*    (2006.01)
    *G11C 29/26*     (2006.01)

(52) U.S. Cl.
    CPC ....... *G06F 13/1668* (2013.01); *G06Q 10/087* (2013.01); *G11C 29/16* (2013.01); *G11C 2029/2602* (2013.01)

(56) References Cited

U.S. PATENT DOCUMENTS

| | | | |
|---|---|---|---|
| 6,874,111 | B1 | 3/2005 | Adams et al. |
| 7,289,537 | B1* | 10/2007 | Devanagondi ........ H04L 49/109 370/412 |
| 7,360,134 | B1* | 4/2008 | Jacobson ........... G01R 31/3187 714/30 |
| 10,902,933 | B2* | 1/2021 | Kalva ............ G01R 31/318555 |
| 2002/0199136 | A1 | 12/2002 | Ku |
| 2003/0120974 | A1* | 6/2003 | Adams .................... G11C 29/16 714/31 |
| 2008/0098269 | A1* | 4/2008 | Bhavsar ................. G11C 29/16 714/733 |
| 2012/0137185 | A1 | 5/2012 | Venkataramanan et al. |
| 2019/0195947 | A1 | 6/2019 | Sarangi et al. |

OTHER PUBLICATIONS

International Search Report and Written Opinion for International Application No. PCT/US2019/055667 filed Oct. 10, 2019.
International Preliminary Report on Patentability received for PCT Patent Application No. PCT/US2019/055667, dated Apr. 22, 2021, 10 pages.

* cited by examiner

| SEQUENCE NAME | TEST DATA IN IMAGE | DEVICE SELECTION AND PACKET TYPE | SEQUENCE CONTENTS |
|---|---|---|---|
| SEQ-A1 | H1<br>D1<br>S1 | DEVICE A<br>PACKET TYPE = JTAG | * CONFIGURES THE JTAG FOR MBIST AND LBIST<br>* TRIGGER MBIST |
| SEQ-A2 | H2<br>S2 | DEVICE A<br>PACKET TYPE = WAIT | CONTAINS WAIT CYCLES FOR MBIST TO FINISH |
| SEQ-B1 | H3<br>D2<br>S3 | DEVICE B<br>PACKET TYPE = JTAG | * CONFIGURES THE JTAG FOR MBIST AND LBIST<br>* TRIGGER MBIST |
| SEQ-B2 | H4<br>S4 | DEVICE B<br>PACKET TYPE = WAIT | CONTAINS WAIT CYCLES FOR MBIST TO FINISH |
| SEQ-A3 | H5<br>R1<br>S5 | DEVICE A<br>PACKET TYPE = JTAG | CONTAINS INSTRUCTIONS TO READ MBIST RESULTS |
| SEQ-B3 | H6<br>R2<br>S6 | DEVICE B<br>PACKET TYPE = JTAG | CONTAINS INSTRUCTIONS TO READ MBIST RESULTS |
| SEQ-A4 | H7<br>D3<br>S7 | DEVICE A<br>PACKET TYPE = LBIST | CONTAINS THE SEED FOR LBIST |
| SEQ-B4 | H8<br>D4<br>S8 | DEVICE B<br>PACKET TYPE = LBIST | CONTAINS THE SEED FOR LBIST |
| SEQ-A5 | H9<br>R3<br>S9 | DEVICE A<br>PACKET TYPE = LBIST | READ RESULTS FOR LBIST |
| SEQ-B5 | H10<br>R4<br>S10 | DEVICE B<br>PACKET TYPE = LBIST | READ RESULTS FOR LBIST |

FIGURE 6

| | | INTERLEAVED PHYSICAL IMAGE WITH TEST DATA |
|---|---|---|
| PACKET ID | ILLUSTRATION OF LINKS TO OTHER PACKETS IN MEMORY | EXAMPLE PACKET CONTENTS OF SOME HEADER DATA PACKETS |
| H1 | | <DEVICE ID=A><PACKET TYPE=JTAG><DATA PACKET ADDRESS=D1 MEMORY LOCATION><DATA PACKET SIZE=D1 SIZE><TEST STATUS ADDRESS=S1 MEMORY LOCATION><IS LAST HEADER=NO><CHIPLET ID=001><NEXT HEADER ADDRESS=H2 MEMORY LOCATION> |
| H2 | | <DEVICE ID=A><PACKET TYPE=WAIT><TEST STATUS ADDRESS=S2 MEMORY LOCATION><IS LAST HEADER=NO><NEXT HEADER ADDRESS=H3 MEMORY LOCATION> |
| H3 | | <DEVICE ID=B><PACKET TYPE=JTAG><DATA PACKET ADDRESS=D2 MEMORY LOCATION><DATA PACKET SIZE=D2 SIZE><TEST STATUS ADDRESS=S3 MEMORY LOCATION><IS LAST HEADER=NO><CHIPLET ID=010><NEXT HEADER ADDRESS=H4 MEMORY LOCATION> |
| H4 | | <DEVICE ID=B><PACKET TYPE=WAIT><TEST STATUS ADDRESS=S4 MEMORY LOCATION><IS LAST HEADER=NO><NEXT HEADER ADDRESS=H5 MEMORY LOCATION> |
| H5 | | <DEVICE ID=A><PACKET TYPE=JTAG><DATA PACKET SIZE=0><TEST STATUS ADDRESS=S5 MEMORY LOCATION><TEST RESULTS ADDRESS=R1 MEMORY LOCATION><TEST RESULTS SIZE=SIZE OF RESULTS FROM RUNNING D1><IS LAST HEADER=NO><NEXT HEADER ADDRESS=H6 MEMORY LOCATION> |
| H6 | | <DEVICE ID=B><PACKET TYPE=JTAG><DATA PACKET SIZE=0><TEST STATUS ADDRESS=S6 MEMORY LOCATION><TEST RESULTS ADDRESS=R2 MEMORY LOCATION><TEST RESULTS SIZE=SIZE OF RESULTS FROM RUNNING D2><IS LAST HEADER=NO><NEXT HEADER ADDRESS=H7 MEMORY LOCATION> |
| H7 | | <DEVICE ID=A><PACKET TYPE=LBIST><DATA PACKET ADDRESS=D2 MEMORY LOCATOIN><DATA PACKET SIZE=D3 SIZE><TEST STATUS ADDRESS=S7 MEMORY LOCATION><IS LAST HEADER=NO><NEXT HEADER ADDRESS=H8 MEMORY LOCATION> |
| H8 | | |
| H9 | | |
| H10 | | |
| D1 | | |
| D2 | | |
| D3 | | |
| D4 | | |
| R1 | | |
| R2 | | |
| R3 | | |
| R4 | | |
| S1 | | |
| S2 | | |
| S3 | | |
| S4 | | |
| S5 | | |
| S6 | | |
| S7 | | |
| S8 | | |
| S9 | | |
| S10 | | |

TEST SYSTEMS FOR EXECUTING SELF-TESTING IN DEPLOYED AUTOMOTIVE PLATFORMS

CROSS-REFERENCE TO RELATED APPLICATIONS

This application claims benefit to U.S. Provisional Patent Application No. 62/743,904, filed on Oct. 10, 2018, which is incorporated by reference herein in its entirety.

BACKGROUND

Computing chips are typically tested by manufacturers prior to deployment to verify whether the chips are functioning properly and whether there are any manufacturing defects. For example, the chips may be tested prior to deployment by using Automated Test Equipment (ATE). However, some chips develop faults after being deployed due to a variety of potential factors—e.g., environmental hazards, aging, etc. Identifying latent faults on a chip after the chip has been deployed in the field is also necessary to comply with certain industry standards, such as the ISO26262 ASIL-C requirement for automotive components (e.g., a chip supporting an automotive platform). To address this need, built-in self-test (BIST) systems have been developed for running both logic BIST (LBIST) and memory BIST (MBIST) on integrated circuits (ICs).

In some instances, these ICs that are testable using BIST may be, for example, a complex IC, such as a chip, a system-on-a-chip (SoC), or a computing platform that includes multiple devices (e.g., a chip(s) and a processor(s)). As such, conventional systems may perform BIST on multiple in field devices of a single integrated system or platform (e.g., an autonomous vehicle computing platform, a medical imaging or diagnostics platform, a high performance computing platform in a datacenter, etc.), and often BIST is performed on the multiple devices using test data stored in off-chip system memory (e.g., flash memory, an embedded Multi-media Controller (eMMC)). However, in some instances, only one of the devices being tested (e.g., a SoC) will have direct access to the off-chip system memory, while another device being tested (e.g., a processor) does not have direct access and thus can exchange information with the off-chip system memory only by using the device having direct access as a proxy. For example, in these conventional systems, since the device with indirect access to the off-chip memory is forced to wait until the device with direct access has completed a test in order to access the off-chip system memory, the device with indirect access may not be tested as frequently as necessary to comply with industrial standards, or the accumulation of time for testing both devices may be undesirable for the device's purpose or operating constraints.

In addition, some conventional systems may experience other issues including, for example, a requirement to store separate copies of test data for each of a number of chiplets in the device that may be tested. In such an example, a device might be divided into multiple logical chiplets that are tested using the same test data, but these conventional systems may store separate copies of the test data for each chiplet, resulting in a large amount of redundant test data and significant memory usage to store the same. Further, in some conventional systems, a device might be shipped with different stock keeping unit (SKU) configurations from the device manufacturer, and each SKU configuration may use different test data. As a result, these conventional systems may use a separate image of off-chip system memory for the test data of each SKU configuration, thereby further increasing the memory usage and requirements for providing BIST capabilities.

SUMMARY

The present disclosure relates to a test system for identifying latent faults on devices—such as chips—while deployed in the field by executing memory built-in self-test (MBIST) and logic built-in self-test (LBIST). More specifically, the present disclosure describes a header data packet that precedes upcoming data and that includes a set of information fields, which control a test flow and permit concurrent BIST execution on separate chips. For example, one or more information fields may include data instructing a first device being tested to pause while BIST is being executed, which permits a second device to retrieve data for testing in parallel. In addition, the present disclosure includes a memory organization (e.g., in an off-chip system memory) that leverages the information fields of the header packet structure and that stores test sequence data (e.g., test sequences or results or processing the same).

In contrast to conventional systems, such as those described above, the test sequence header packet structure may permit scheduling and running concurrent tests on multiple devices, including a first device with direct access to shared off-chip system memory and a second device with indirect access to shared off-chip system memory. In another aspect of the present disclosure, multiple fields of the header packet may contain links to data in the off-chip system memory and, as a result, the data may be stored only once and linked to multiple instances of BIST on different chiplets. Furthermore, as opposed to storing a separate image of off-chip system memory for each stock keeping unit (SKU), an aspect of the present disclosure includes storing a superset of all SKU configurations in a single image and inserting a SKU packet prior to the header packet to permit a device to determine whether a header packet associated with that SKU should be retrieved. These aspects may improve efficiency and reduce storage associated with running BIST.

BRIEF DESCRIPTION OF THE DRAWINGS

The present systems and methods for a test system for executing in field built-in self-test (BIST) are described in detail below with reference to the attached drawing figures, which are incorporated herein by reference:

FIG. 6 depicts a table representing a logical image of memory storing packets that may be exchanged between a memory device, an IST master sequencer, and an IST slave sequencer, in accordance with some embodiments of the present disclosure;

FIG. 7 depicts a table representing a physical image of memory storing the packets identified in FIG. 6, in accordance with some embodiments of the present disclosure;

DETAILED DESCRIPTION

Figure 1:
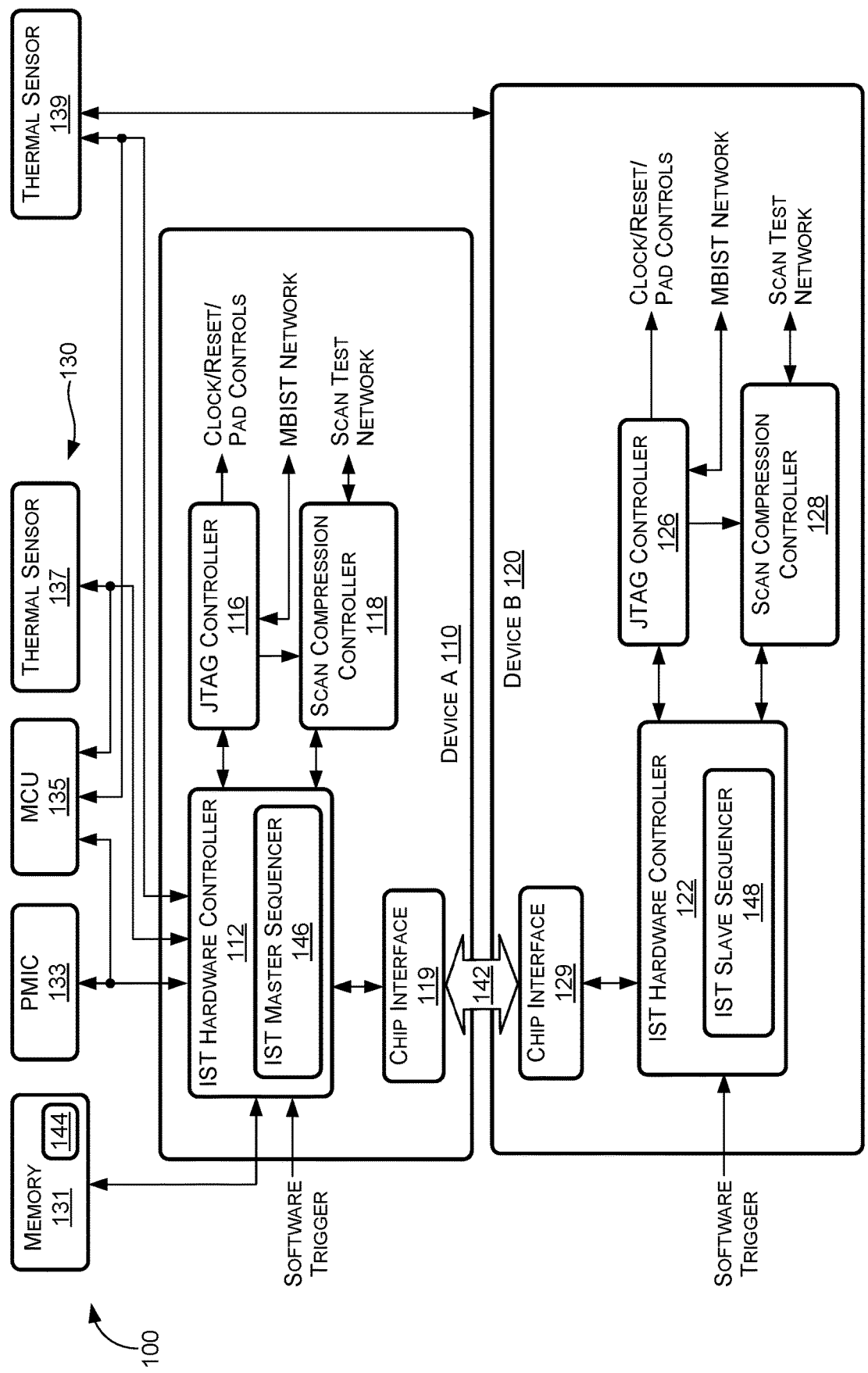
FIG. 1 is a block diagram of a computing environment, including an integrated circuit with a first device (e.g., an SoC) and a second device (e.g., a processor) having components for running BIST on each device, in accordance with some embodiments of the present disclosure.

Systems and methods are disclosed related to a test system for executing built-in self-test (BIST) of integrated circuits (ICs) in the field. One or more of the ICs may be, for example, a complex IC such as a chip, a system-on-a-chip (SoC), or a computing platform that includes one or more chips and one or more processors (e.g., a graphics processing unit (GPU) or a central processing unit (CPU)). At a high level, in-system test (IST) includes software and hardware that cooperate to provide for testing of the IC, including testing of a single chip, testing of multiple chips, or a combination thereof. For example, testing hardware may be programmed to retrieve testing sequences, facilitate test execution, and/or write test results to memory. In some embodiments, a test sequence header packet structure that includes a set of information fields may be used to control a test flow and permit concurrent BIST execution on separate chips. In addition, the present disclosure may include a memory organization (e.g., in off-chip system memory) that leverages the information fields of the header packet structure and that stores test sequence data (e.g., test sequences or results).

In some embodiments, a test sequence header packet structure may be used to perform scheduling and running concurrent tests on multiple devices, including a first device with direct access to shared off-chip system memory and a second device with indirect access to shared off-chip system memory—in contrast to conventional systems. More specifically, after BIST—e.g., memory BIST (MBIST)—is triggered on the first device, at least one of the information fields in the header packet may include a WAIT instruction, which may trigger a wait cycle counter on the first device. As such, a pause may be issued for the next packet intended for the first device until the counter is expired, and during this pause, packets may be fetched and communicated to the second device. This is in contrast to conventional systems where the first device typically blocks packets to the second device when the first device is busy running BIST until completion of BIST on the first device. As such, in accordance with the present disclosure, by triggering the wait cycle counter of the first device when the first device is busy running BIST, the first device does not block packets to the second device and thus allows BIST to run on both devices in parallel. Using this technique, runtime of the system for executing BIST may be reduced as compared with conventional systems, thereby enabling the system to operate in real-time deployment scenarios (e.g., in automotive applications, medical diagnostics or imaging applications, high powered computing applications, etc.).

In another aspect of the present disclosure, multiple fields of the header packet may contain links (e.g., storage addresses) to data in the off-chip system memory, and each of these linked header packet fields may enable more efficiency and reduced storage associated with running BIST. For example, the header packet may include a "data packet address" field storing an address of a "data packet" in the off-chip system memory. In another example, the header packet may include a "test results address" field indicating a location in the off-chip system memory at which test results may be written, as well as a "test status address" field indicating a location in the off-chip system memory at which test-status data may be written.

Each linked header packet field may contribute to improved BIST in various manners. For example, the linked data packet address may permit storage of a single instance of test data in the off-chip system memory, and different header packets for different BIST may point to the single instance. That is, a device might be divided into multiple logical chiplets, which are tested using the same test data. As such, in contrast to conventional systems using a separate copy of the test data for each chiplet, the system of present disclosure may program a separate header for each chiplet, and each separate header may point to the same data packet address storing the single instance of test data. In this respect, the amount of storage for the test data may be reduced, since only a single instance of the test data is stored.

In another aspect of the present disclosure, the test results address and the test status address may enable storage of the results and status in close proximity in the off-chip system memory. That is, after BIST is run, devices may shut down, and upon subsequent system boot, the results and status may be read from the off-chip system memory (e.g., by software) to determine whether one or more devices subject to BIST either passed or failed. In contrast, conventional systems may store the results and status in the same order as executed, which may result in packets being stored in locations that are not proximate to one another thereby complicating reading of the packets. In at least one embodiment of the present disclosure, by specifying predetermined memory locations at which results are to be written in the header packet, results and status packets may be stored proximate to one another in the off-chip system memory. As such, a discrete segment of the memory may be more efficiently read to check the results of BIST, thereby further reducing runtime for the system.

In some instances, a device may be provided from a manufacturer with different stock keeping units (SKUs), each of which may use different fuse configurations and may use different test data to run BIST. Conventional approaches may store a separate image of off-chip system memory for each SKU. In contrast, an aspect of the present disclosure includes storing a superset of all SKU configurations in a single image and inserting a SKU packet prior to the header packet to permit a device to determine whether a header packet associated with that SKU should be retrieved. The SKU packet may include a SKU ID correlating with a fuse configuration and, as a result, each device may compare the SKU ID to a present fuse configuration (e.g., in a floor sweep) to assess whether the SKU matches. If the SKU does not match and/or it is not the last SKU packet, then the next SKU packet may be read, and/or if it is the last SKU packet the device may shutdown. If the SKU does match, then the next header packet may be read to proceed with the testing, as described above. By programming a SKU packet into the packet stream, the present disclosure provides a mechanism to select a specific header packet and linked test data based on whether the SKU configuration matches. In addition, programming a SKU packet into the packet stream provides a mechanism by which SKU specific test data may be fetched from a single image of the system memory. Furthermore, the efficiencies gained by pointing to a single copy of test data may be realized in the context of multiple SKUs that run BIST using the same test data.

With reference to FIG. 1, FIG. 1 illustrates a block diagram of an embodiment of an integrated circuit (IC) 100. The IC 100 may be a functional computing platform having a first device and a second device. In FIG. 1 the first device is identified as "Device A" 110 (e.g., a system on a chip (SoC)), and the second device is identified as "Device B" 120 (e.g., Device B 120). However, in other aspects, the Device A 110 and the Device B 120 might include various other or alternative types of ICs or chips. Both the Device A 110 and the Device B 120 include respective components for executing BIST (e.g., IST hardware controller 112 and IST hardware controller 122), and are either directly or indirectly coupled to platform components 130. For a non-limiting example, in FIG. 1, the Device A 110 is directly connected to the platform components 130, and the Device B 120 is indirectly connected to the platform components 130 by way of the Device A 110 (e.g., through a link (e.g., PCIe link) 142 between a Device A chip interface 119 and a Device B chip interface 129).

The IC 100 also includes various platform components that interact with at least one of the IST hardware controllers during IST of the IC 100. Examples of platform components include, but are not limited to: system memory 131 (e.g., flash memory, embedded Multi-Media Controller (eMMC) memory, etc.); power management IC (PMIC) 133; microcontroller 135; thermal sensor 137; and thermal sensor 139. These various platform components may be referred to collectively herein as platform components 130. Connections between the components of the IC 100 may be via any suitable means. The IC 100 may be part of a functional system that has completed production and has been deployed (or is ready to be deployed) in the field. Example functional systems may include: deployed autonomous vehicles, aircraft, drones, water vessels, construction equipment, and/or other vehicle types; medical imaging systems; medical diagnostics systems; and high power computing systems. However, the deployment systems are not limited to these examples, and any application with integrated chips (e.g., where latent, permanent, transient, or other fault types may develop in deployment) may be suitable for the aspects of the present disclosure.

Having described the IC 100 more generally, some of the specific components of the Device A 110 and the Device B 120 will now be described in more detail. The Device A 110 includes an IST hardware controller 112, a JTAG controller 116, a scan compression controller 118, and a chip interface 119. Similarly, the Device B 120 also includes an IST hardware controller 122, a JTAG controller 126, a scan compression controller 128, and a chip interface 129. The components of the Device A 110 and the Device B 120 are for example purposes only, and these devices may include additional and/or alternative components that are not illustrated in FIG. 1—such as components that may be included in a chip or chiplet (e.g., an SoC or a processor). For example, the Device A 110 may include an operational controller for an SoC, which may be distinct from the dedicated IST hardware controller 112. Other components may include input/output contacts and control circuitry, a MBIST network, a scan test network, a boot processor, and/or functional logic.

The IST hardware controller 112 may include logic circuitry that directs IST for the Device A 110 and/or communication interfaces (see e.g., FIG. 2) that communicate with the platform components 130, the JTAG controller 116, the scan compression controller 118, and the chip interface 119, during the IST. The IST hardware controller 112 may advantageously allow IST of a chip in a functional system. For example, the IST hardware controller 112 may receive an IST trigger (e.g., a software trigger) to initiate the IST. In some embodiments, the IST trigger may be provided or generated by the microcontroller 135 during a boot process (e.g., a power-up or power-down process) for the Device A 110.

After receiving the IST trigger, the IST hardware controller 112 may fetch test patterns and other testing data from the memory 131 and may communicate the test patterns to the JTAG controller 116 and the scan compression controller 118 for performing the IST. As such, the IST hardware controller 112 may be configured to interact with both the JTAG controller 116 and the scan compression controller 118 to initiate IST by applying test patterns to the MBIST network and the scan test network of the Device A 110.

The JTAG controller 116 and the scan compression controller 118 may be controllers located in chips that are used to control testing of MBIST networks and scan networks of the chips. In non-limiting embodiments, the JTAG controller 116 may be compliant with the IEEE 1500 standard.

The platform components 130 may be include components that are included or used in functional systems. The platform components 130 also include additional functionality associated with IST, as disclosed herein. For example, the memory 131 may store the structural test patterns that are used for the IST and the test results of the IST. In such an example, the IST hardware controller 112 may have a direct communication path with the memory 131.

The PMIC 133 may provide power management for the system 100, and the microcontroller 135 may manage operations of the system 100 and/or control the boot process for the system 100 to enter the functional mode. The boot process for the functional mode may include standard boot commands. In addition, the microcontroller 135 may control transitioning from booting for the functional mode to the IST mode. As such, the microcontroller 135 may place the Device A 110 and the Device B 120 in IST mode. Once the Device A 110 is powered-on, the microcontroller 135 may go through the boot process where a portion of the boot code directing the boot process extracts test information that is used to run the IST mode and to load software blocks that will direct setting up the system 100 for IST. In some embodiments, the Device A 110 may include a boot processor that runs a boot ROM and gets the Device A 110 up and running. In such embodiments, the boot processor may include software commands that control the transition to IST mode.

Preparing the system for IST mode may include preparing all the clocks and the voltage settings of the Device A 110 for testing so that IST may be run with correct clock settings, correct voltage settings, and correct I/O controls to isolate the Device A 110 from other components of the IC 100 while in the IST mode and notify the other components that the Device A 110 is entering IST mode. Before entering the IST mode, the I/O contacts may be placed in a platform friendly state that is maintained during the IST. The PMIC 133 and the thermal sensors 137, 139, may also be set for IST.

Accordingly, the thermal sensors 137, 139, may be used for the IST mode instead of for functional behavior. Transitioning to the IST mode results in the microcontroller 135 focusing on IST triggers, such as from the thermal sensors 137, 139, and ignoring other triggers when in the IST mode.

The thermal sensor 137 may be an external thermal sensor dedicated to the Device A 110 and the thermal sensor 139 may be an external thermal sensor dedicated to the Device B 120. Different triggers may be set for the thermal sensors 137, 139 for the IST mode as compared to triggers used for the functional mode.

The chip interface 119 may be dedicated for communications between the IST hardware controller 112 of the Device A 110 and the IST hardware controller 122 of the Device B 120. In non-limiting embodiments, the chip interface 119 may be a multiplexer ("mux"). The chip interface 119 may communicate with the IST hardware controller 122 via the chip interface 129, which may also be dedicated for IST communication between the IST hardware controllers 112, 122. In one example, the IST hardware controllers 112, 122 may establish a link 142 (e.g., via a PCIe link) between the chip interfaces 119, 129 to transport test data and results between the Device B 120 and the memory 131. The chip interfaces 119, 129 may allow multiplexing an IST specific data path onto a link data bus (e.g., a PCIe data bus). An IST specific protocol may be used to communicate over the link data bus between the chip interfaces 119, 129. As such, the chip interfaces 119, 129 may be paired such that they only understand each other. In some embodiments, one or more of the chip interfaces 119, 129 may be integrated within their respective IST hardware controller.

The IST hardware controller 122 may be configured to perform IST for the Device B 120, and the IST hardware controller 122 may function similarly to the IST hardware controller 112 by delivering test patterns from the memory 131 to the JTAG controller 126 and the scan compression controller 128 for IST of the Device B 120. As with the JTAG controller 116 and the scan compression controller 118, the JTAG controller 126 and the scan compression controller 128 may be controllers located within a processor, such as a GPU. As noted above, unlike the IST hardware controller 112, the IST hardware controller 122 may communicate with the memory 131 via the muxes 119, 129 to receive test patterns for the Device B 120 and provide test results.

Figure 2:
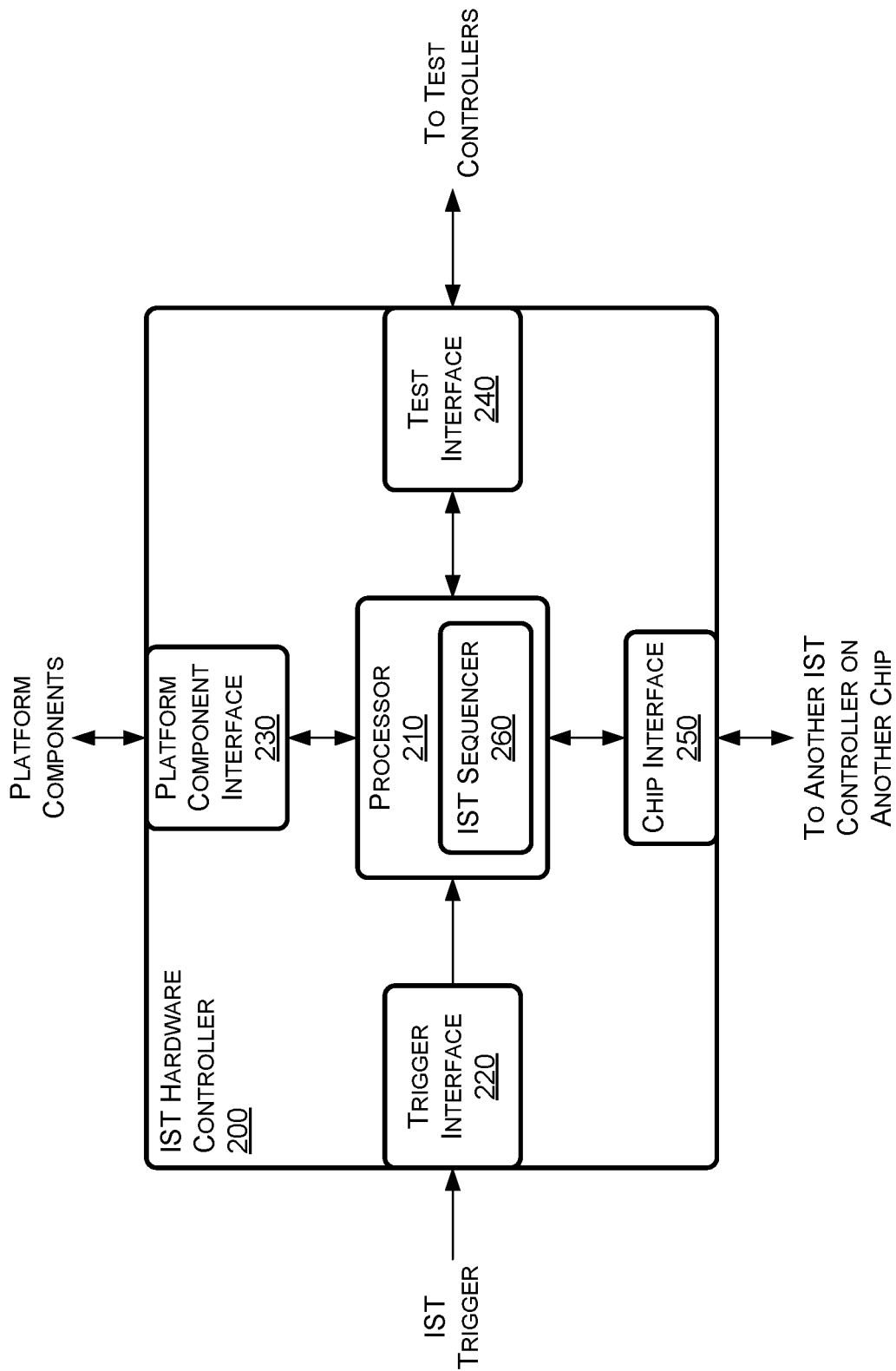
FIG. 2 is a block diagram of an in-system test (IST) hardware controller, in accordance with some embodiments of the present disclosure.

FIG. 2 illustrates a block diagram of an embodiment of an in-system test (IST) hardware controller 200. Although not illustrated, some or all of the components depicted in FIG. 2 may execute operations of the IST hardware controller 200. For example, the IST hardware controller 112 and the IST hardware controller 122 may include one or more of the components of the IST hardware controller 200. The IST hardware controller 200 may be located within a chip of a functional computing system that is configured to perform IST of the chip. The functional computing system may be, for example, a computing platform. The IST hardware controller 200 may include a processor 210 to direct operation of the IST and interfaces for communicating with other components. The interfaces may include a trigger interface 220, an external component interface 230, a testing interface 240, and/or a chip interface 250. The trigger interface 220, the external component interface 230, and/or the testing interface 240 may include communication ports from which signals are received and transmitted. As discussed above with respect to the chip interfaces 119, 129, the chip interface 250 may be specifically dedicated for IST communications. In some embodiments, the chip interface 250 may be used to communicate with platform components.

The processor 210 may control the IST of the chip. As such, the processor 210 may be configured to initiate the IST for the chip, obtain test patterns for the IST, direct delivery of the test patterns to test controllers of the chip, and/or direct the delivery of the test results of the IST for storage. The processor 210 may control the order of testing different portions of the chip. Additionally, the processor 210 may cooperate with another IST hardware controller of another chip to coordinate testing for both of the chips. In one aspect of the disclosure, the processor 210 may include an IST sequencer 260 to read and direct incoming data and direct outgoing data. The IST sequencer 260 may be either an IST master sequencer (e.g., IST master sequencer 146 in FIG. 1) or an IST slave sequencer (e.g., IST slave sequencer 148 in FIG. 1).

The trigger interface 220 may be configured to receive an IST trigger to initiate IST in the IST hardware controller 200. The IST trigger may be a software trigger received from a platform component, such as a microcontroller or a boot controller, or another component external to the IST hardware controller 200.

The platform component interface 230 may be configured to communicate with various components, such as the platform components 130 of FIG. 1. The testing interface 240 may be configured to communicate with on-chip test controllers, such as a JTAG controller and a scan compression controller, to transmit test patterns for IST and receive results of the tests.

The chip interface 250 may perform IST communication with another IST hardware controller. As such, in some applications the chip interface 250 may not be employed for IST but may be used to establish a link (e.g., PCIe link) for communication with the other IST hardware controller by allowing multiplexing of an IST specific data path onto a link data bus (e.g., PCIe data bus).

Referring back to FIG. 1, in at least one embodiment the Device A 110 and the Device B 120 may exchange data with the memory 131 (e.g., serially), based on the configuration of the link 142. For example, the memory 131 may include test data 144, which may include test instructions, test sequences (e.g., for executing BIST), test results, test statuses, etc. In some examples, test data may be retrieved by either the Device A 110 or the Device B 120, but may not be accessible to both the Device A 110 and the Device B 120 at the same time. For example, when the Device A 110 is retrieving test data 144 from the memory 131 (or communicating test data to the memory 131), then the Device B 120 may not be able to simultaneously retrieve test data from the memory 131 (e.g., by way of the link 142). Likewise, when the Device B 120 is retrieving test data 144 from the memory 131 (or communicating test data to the memory 131) by way of the link 142, then the Device A 110 may not be able to simultaneously exchange data with the memory 131.

As such, the test system of the present disclosure may include a combination of hardware and software to permit concurrent testing of the Device A 110 and the Device B 120. More specifically, the Device A 110 and the Device B 120 may exchange packets of test related data with the memory 131 (e.g., packets including test sequences, test results, test status, etc.). As depicted in FIG. 1, the IST hardware controller 112 of the Device A 110 includes an IST master sequencer 146, which may exchange packets with the memory 131. Also depicted in FIG. 1, the IST hardware controller 122 of the Device B 120 may include an IST slave sequencer 148, which may access the test data 144 by way of the IST master sequencer 146. In at least one embodiment, "master sequencer" and "slave sequencer" may describe the relationship of the sequencers 146 and 148, since the IST slave sequencer 148 may access the memory 131 by way of the IST master sequencer 146 using the link 142. In further contrast to conventional systems, an aspect of the present disclosure may include a header data packet that precedes upcoming test data and that instructs a device (e.g., IST master sequencer 146 or IST slave sequencer 148) how to process upcoming test data.

A header data packet may include a variety of different data fields, and a non-limiting list of example data fields is provided below in Table 1.

TABLE 1

Header Data Packet Information Fields

| Field name | Description |
| --- | --- |
| Device A or B (e.g., Device ID) | indicates whether this packet is for Device A (e.g., Device A 110) or B (e.g., Device B 120) |
| Packet Type | indicates whether the packet type is JTAG, LBIST or WAIT |
| Data Packet Address | points to the DATA packet (e.g., in the memory 131) |
| Data Packet Size | |
| Next Header Address | After the execution of this Header and corresponding DATA -> RESULTS-> STATUS packets, the next header is fetched from this location (e.g., from this location in the memory 131) |
| Is Last header | Indicates if this is the last header. If it is high, IST is done after the STATUS packet corresponding to this HEADER. |
| Wait Cycles | Applicable if the packet type is "WAIT". Used to introduce WAIT cycles between any packets |
| Test Results Address | Test results corresponding to this HEADER packet are written at this address (e.g., at this address in the memory 131) |
| Test Results Size | |
| Test status Address | STATUS packet is written at this address (e.g., at this address in the memory 131) |
| Chiplet ID | Indicates the chiplet ID(s). There is one bit per chiplet, so the same DATA packet may be broadcasted to multiple chiplets to achieve concurrency |

Each information field of the header data packet may include various types of information. For example, some information fields may include instructions to the IST master sequencer 146 or to the IST slave sequencer 148, while other information fields may include links to addresses in the memory 131 at which test data may be read or written by the IST master sequencer 146 or by the IST slave sequencer 148. Examples of other test data that may be linked using the header data packet include DATA packet (e.g., may contain JTAG instructions or LBIST seed depending on the packet type); RESULTS packet (e.g., after IST is run, the data from the RESULTS packet is written in the external flash memory module); and/or STATUS packet (e.g., indicates whether master or slave wrote the STATUS packet and/or contains error codes, such as if any timeouts happened or any thermal interrupts happened).

Figure 3A:
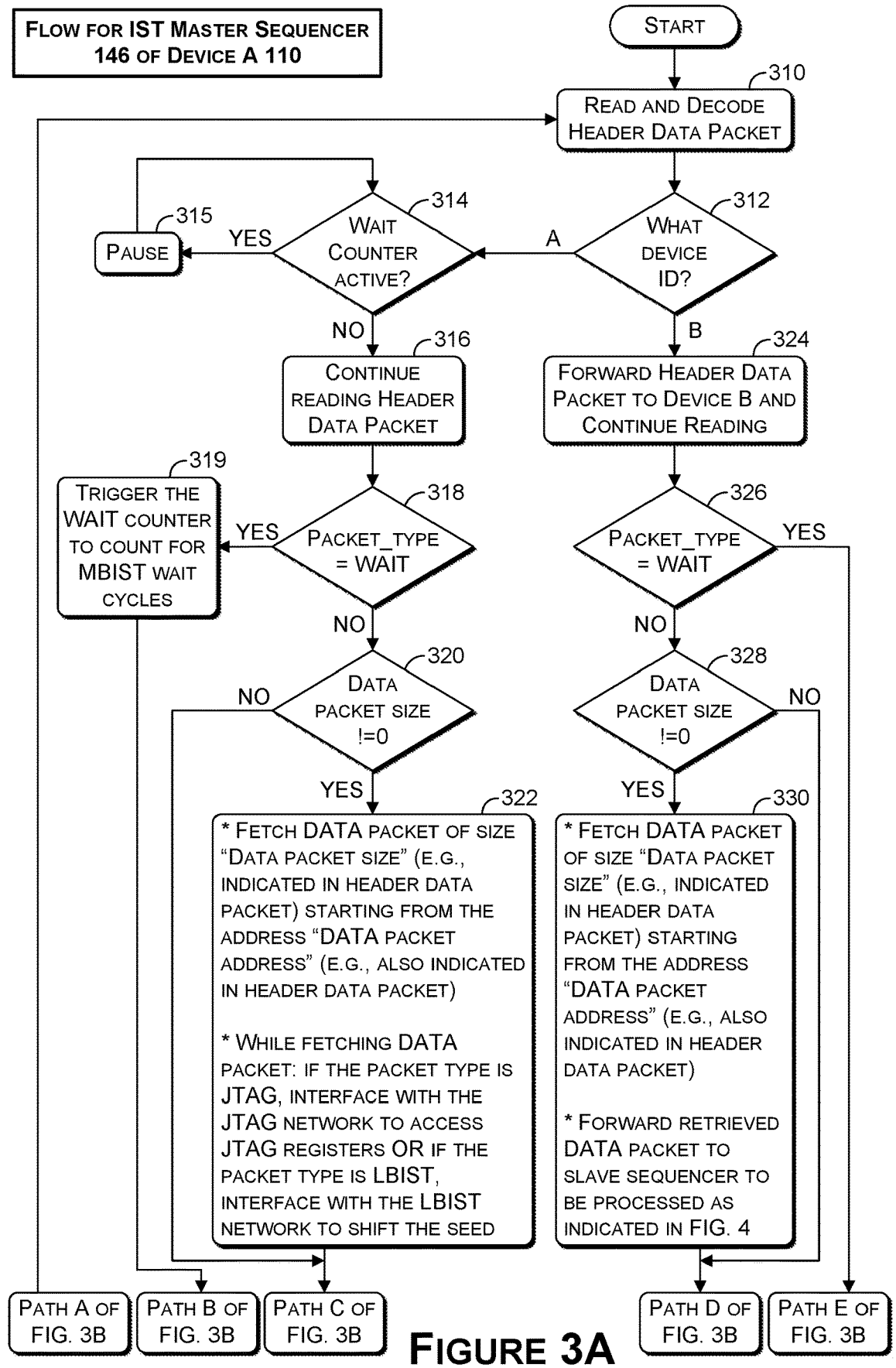
FIGS. 3A and 3B depict a flow diagram showing a process for an IST master sequencer, in accordance with some embodiments of the present disclosure.
Figure 3B:
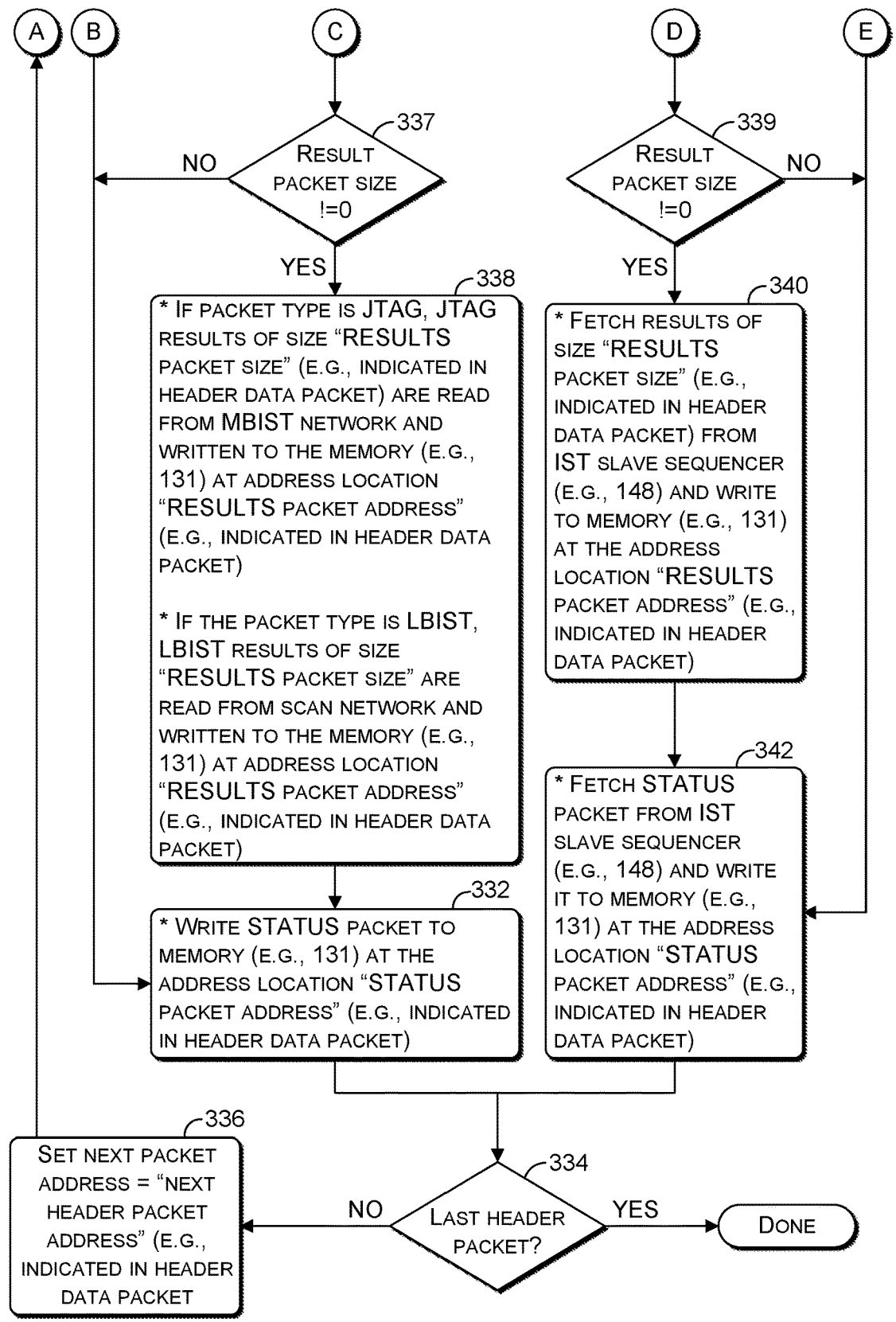
Figure 4:
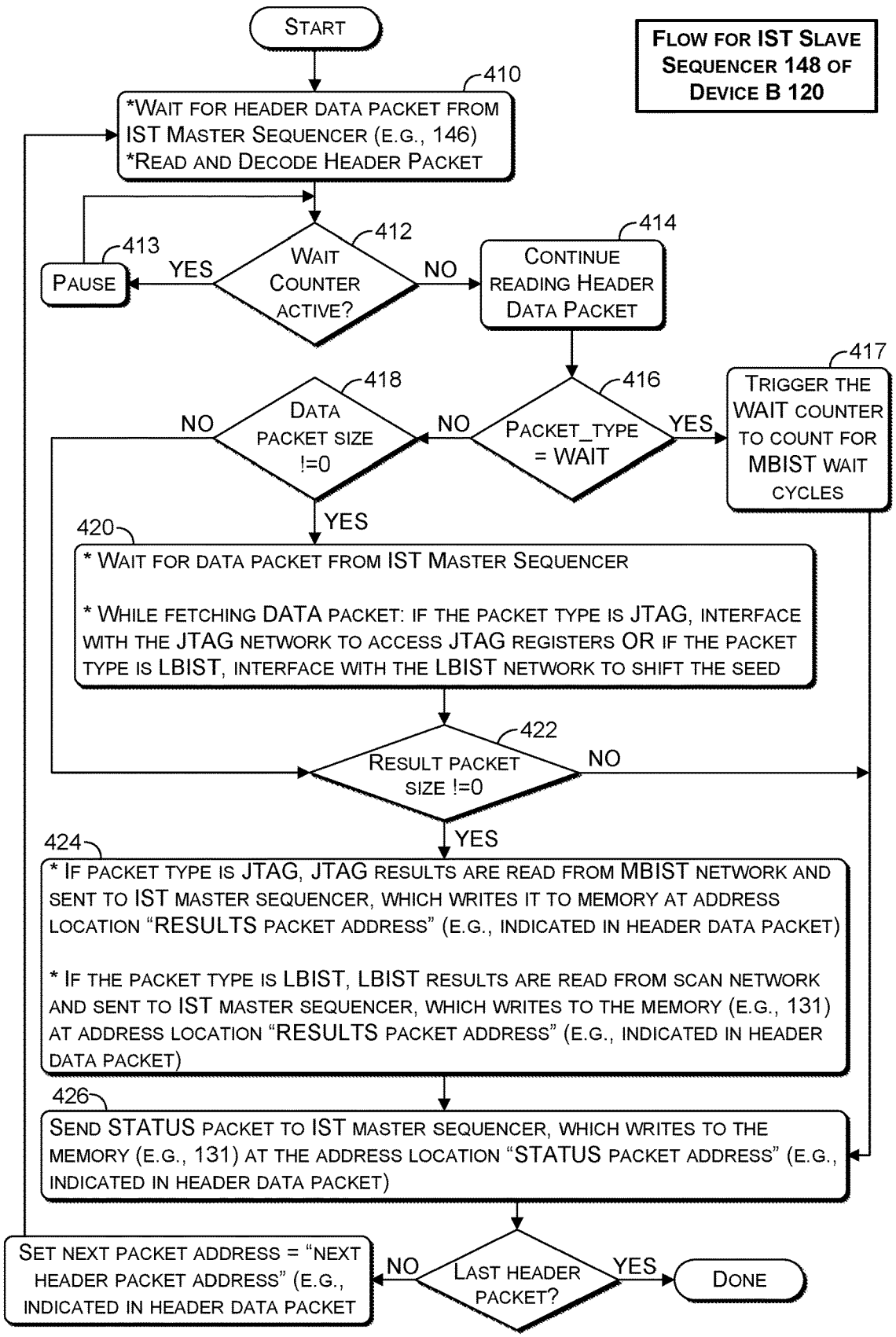
FIG. 4 depicts a flow diagram showing a process for an IST slave sequencer, in accordance with some embodiments of the present disclosure.

Once a software trigger initiates IST, the IST master sequencer 146 and the IST slave sequencer 148 may execute a series of operations based on the header data packets received. For example, FIGS. 3A and 3B illustrate a flow diagram including a series of operations of the IST master sequencer 146, and FIG. 4 illustrates a flow diagram including a series of operations of the IST slave sequencer 146. Both the IST master sequencer 146 and the IST slave sequencer 148 may be programmed with software to execute the respective operations in FIGS. 3A, 3B, and 4. Once Device A 110 enters IST mode, the IST master sequencer 146 reads the first header data packet from the memory 131, which is provided to the IST master sequencer 146 by software. Then, once Device B 120 enters IST mode, the IST slave sequencer 148 runs in parallel to the IST master sequencer 146.

In an aspect of the present disclosure, testing may be concurrently scheduled on the Device A 110 and on the Device B 120, and the architecture may permit concurrent test scheduling in various configurations. For example, referring to FIG. 5, an example test schedule is depicted for MBIST and LBIST on Device A 110 and Device B 120, in which time is represented across the X-axis, moving from left to right, from an earlier point in time to a later point in time. For example, at time T1, while MBIST is being run on Device A 110, test data for running MBIST on device B is being fetched. At time T2, while MBIST is being run on device B, MBIST results from device A are written to flash, and so on.

Figure 5:
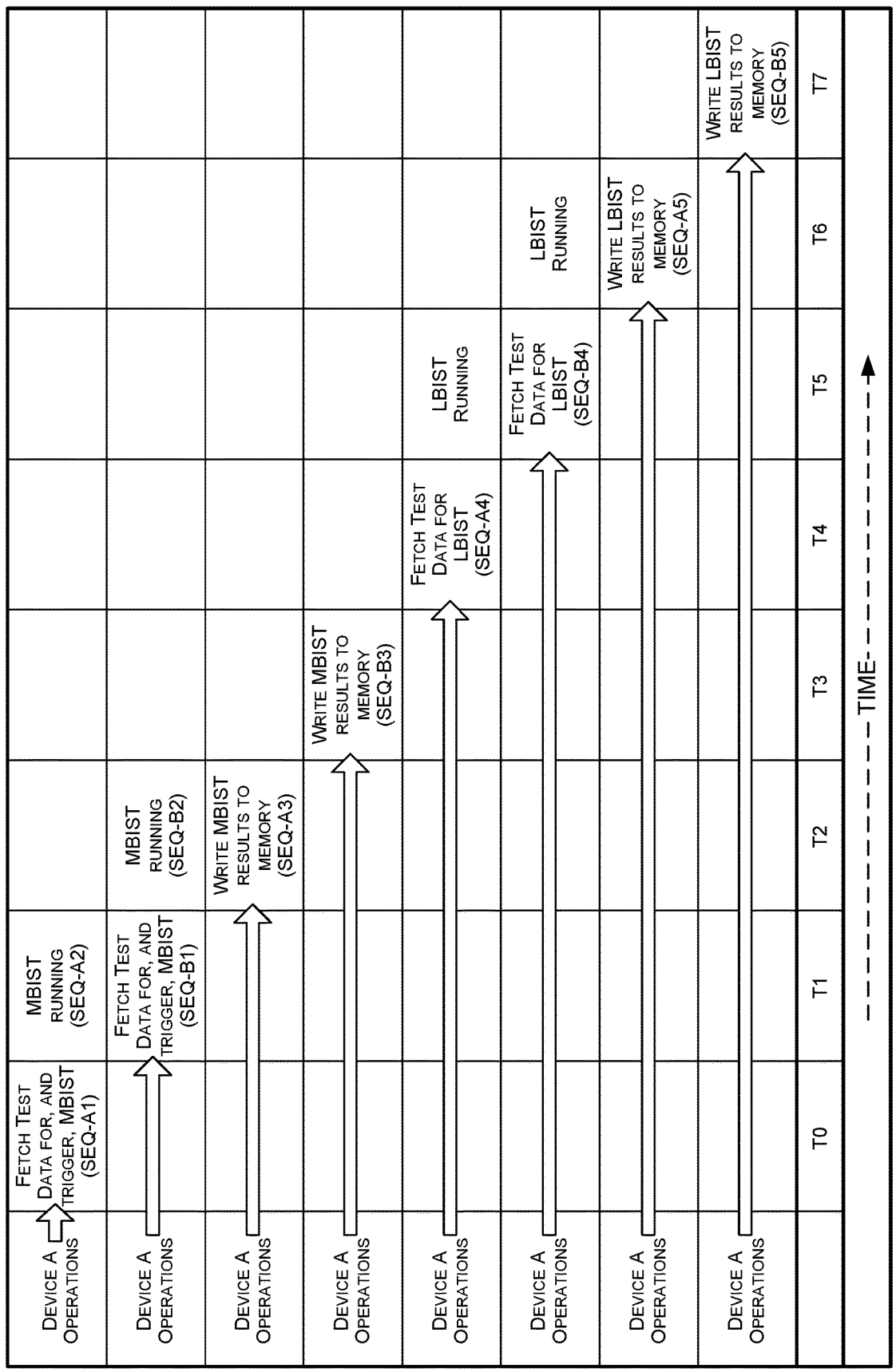
FIG. 5 depicts a test schedule for a Device A and a Device B showing concurrency of testing stages, in accordance with some embodiments of the present disclosure.

While FIG. 5 depicts an example test schedule, including an order in which operations might be carried out by the Device A 110 and the Device B 120, the configuration of the packets in the memory 131 prior to retrieval by the IST master sequencer 146 may contribute to the ability to accomplish the concurrent testing. For example, referring to FIG. 6, a chart illustrates an interleaving of sequences in the logical image on the memory 131. The sequences depicted in FIG. 6 are an example of one aspect of the disclosure, and in other aspects, the interleaving sequences may include additional sequences, alternative sequences, or fewer sequences, depending on the BIST.

With the logical image depicted in FIG. 6, IST may be run on the Device A 110 and the Device B 120 in parallel. More specifically, in SEQ-A1 header sequence H1 (FIG. 6) triggers MBIST on Device A 110, and temporally, this occurs at T0 and T1 of FIG. 5. H1 could include various data identified in Table 1. For example, H1 might include a Device ID (e.g., an identifier of Device A 110), a packet type indicator (e.g., JTAG), a link to the JTAG test data in the memory 131 (e.g., an address in memory 131 at which the JTAG test data is stored), and/or an indication of the size of the JTAG test data. With this H1, the IST master sequencer 146 may proceed through several of the processes outlined in FIG. 3A. For example, the IST master sequencer may sequentially execute 310, 312, 314, 316, 318, 320, and 322, while not performing all of the steps or operations associated with, 315, 319, and 324.

With continued reference to FIG. 6, in SEQ-A2 header sequence H2 triggers a wait cycle counter on Device A 110 to account for the MBIST runtime, and H2 may include various data identified in Table 1. For example, H2 might include a Device ID (e.g., an identifier of Device A 110), a packet type indicator (e.g., WAIT), and/or an enumeration of a quantity of cycles during which Device A should wait (e.g., wait cycles). With this H2, the IST master sequencer 146 may proceed through several of the processes outlined in FIG. 3A, including 310, 312, 314, 316, 318, and 319. During this time, subsequent packets intended for Device A may not be allowed until the counter is expired; instead, a pause may be issued for the next Device A packet until the counter is expired. For example, if the IST master sequencer 146 received another packet and reached decision 314, the IST master sequence 146 could proceed to the pause 315 until the counter was no longer active. Once the wait counter has expired, the IST master sequencer 146 may proceed to process 332 of the flow depicted in FIG. 3B, at which point the IST master sequencer 146 may write STATUS data to the memory 131 at an address identified in H2 (e.g., "Test status address" in Table 1). In addition, the IST master sequencer 146 may proceed to 334 (FIG. 3B) to determine whether H2 is the last header data packet. For example, H2 may include an indication in the "Is Last Header" field representing whether H2 is the last header. If the data in H2 indicates that H2 is not the last header data packet, then the IST master sequencer 146 may proceed to 336 to retrieve a next header data packet, which may also be identified in H2 in the "Next Header Address" field (which is also listed in Table 1).

During the active counter (e.g., process 319 associated with H2), if there are any packets targeted for Device B, they are continued to be fetched and forwarded to IST slave sequencer 148, by way of processes 310, 312, and 324. For example, while MBIST is being run in Device A, header sequence H3 of SEQ-B1 (FIG. 6) is fetched to trigger MBIST in Device B, and this may occur during T1 of FIG. 5. H3 may include various data identified in Table 1, including a Device ID (e.g., an identifier of Device B 120), a packet type indicator (e.g., JTAG), a link to the JTAG test data in the memory 131 (e.g., address in memory 131 at which the JTAG test data is stored), and/or an indication of the size of the JTAG test data. With this H3, the IST master sequencer 146 may proceed through several of the processes outlined in FIG. 3A. For example, the IST master sequencer 146 may sequentially execute 310, 312, 324, 326, 328, and 330. Moreover, once process 324 is executed, and H3 is also forwarded to the IST slave sequencer 148, the IST slave sequencer 148 may run in parallel. For example, referring to FIG. 4, upon receiving H3 from the IST master sequencer 146, the IST slave sequencer 148 may proceed through various processes of the flow, including 410, 412, 414, 416, 418, and 420.

In FIG. 6, header sequence H4 of SEQ-B2 triggers a wait cycle counter on Device B to account for the MBIST runtime on Device B 120, and temporally this may occur at T2 of FIG. 5. H4 may include various data identified in Table 1. For example, H4 might include a Device ID (e.g., an identifier of Device B 120), a packet type indicator (e.g. WAIT), and/or an enumeration of a quantity of cycles during which Device B should wait (e.g., Wait cycles). With this H4, the IST master sequencer 146 and the IST slave sequencer 148 may proceed through several of the processes outlined in FIGS. 3A and 4. For example, the IST master sequencer 146 may proceed through 310, 312, 324, and 326, and the IST slave sequencer 148 may proceed through 410, 412, 414, 416, and 417. At 417, the IST slave sequencer 148 issues a pause for further packets until the counter is expired. Once the counter is expired, the IST slave sequencer 148 may proceed to process 426 of the flow depicted in FIG. 4, at which point the IST slave sequencer 148 may send a STATUS packet to the IST master sequencer 146, which writes it to the memory 131 at an address identified in H4 (e.g., "Test status address" in Table 1). This is indicated at process 342 in FIG. 3B. Both the IST master sequencer 146 and the IST slave sequencer 148 may proceed accordingly depending on whether H4 is the last header data packet, based on the "Is Last Header" field of H4.

Continuing with FIG. 6, for header sequence H5 of SEQ-A3, if the wait counter on the IST master sequencer 146 of the primary device (Device A) is expired, then MBIST results from Device A 110 are read and written at a memory address identified in H5, and temporally, this occurs at T2 of FIG. 5. H5 could include various data identified in Table 1. For example, H5 might include a Device ID (e.g., an identifier of Device A 110), a packet type indicator (e.g., JTAG), a test result address in memory 131 at which results should be written (e.g., an address in memory 131 at which results of the JTAG test data is stored), and/or an indication of the size of the JTAG test result data. With this H5, the IST master sequencer 146 may proceed through several of the processes outlined in FIG. 3A. For example, the IST master sequencer could sequentially execute 310, 312, 314, 316, 318, and 320 of FIG. 3A. Then, if the data packet size is zero, the IST master sequencer 146 proceeds with 337 and 338 of FIG. 3B. If the counter is not expired at 314, then the RESULT packet may be paused until the counter is expired.

Proceeding with the next data in the logical image of FIG. 6, SEQ-B3 includes header sequence H6. Similar to H5, if the wait counter on the IST slave sequencer 148 of the secondary device (Device B) is expired, then MBIST results from Device B 120 are read and written at a memory address identified in H6, and temporally, this occurs at T3 of FIG. 5. H6 could include various data identified in Table 1. For example, H6 might include a Device ID (e.g., an identifier of Device B 120), a packet type indicator (e.g., JTAG), a test result address in memory 131 at which results should be written (e.g., an address in memory 131 at which results of the JTAG test data is stored), and/or an indication of the size of the JTAG test result data. With this H6, the IST master sequencer 146 and the IST slave sequencer 148 may proceed through several of the processes outlined in FIGS. 3A, 3B, and 4. For example, the IST master sequencer may sequentially execute 310, 312, 324, 326, and 328 of FIG. 3A. Then, if the data packet size is zero, the IST master sequencer 146 may proceed with 339 and 340 of FIG. 3B. In parallel, the IST slave sequencer 148 may proceed with 410, 412, 414, 416, 418, 422, and 424 in FIG. 4. After process 424, the IST slave sequencer 148 sends results to the IST master sequencer, which fetches the RESULTS packet and writes to the memory 131, as indicated at 340 of FIG. 3B.

The logical image of FIG. 6 includes a plurality of other sequences including packets for executing LBIST on the Device A 110 and the Device B 120. These sequences may be exchanged between the memory 131, the Device A 110, and the Device B 120 in a manner similar to that described with respect to SEQ-A1 through SEQ-B3. In this respect, while LBIST is running on Device A 110, the seed can be shifted into Device B 120, and when LBIST is being run in Device B 120, results can be read from Device A 112 and written to the memory 131. As a result, in accordance with this present disclosure, while a device is busy, its own packets may be blocked, but the packets of the other device are not blocked. In contrast with conventional test systems, IST may be run in both devices in parallel to improve runtime.

In accordance with one aspect of the disclosure, after IST is run (e.g., as indicated by the "Is Last Header" data field listed in Table 1), both the devices may be shutdown. The next time the system boots, the RESULT and STATUS packets may be read by software from the memory 131 to determine whether the results from the previous IST is a PASS or FAIL.

The IST image in the memory 131 may contain test data, as well as space to which hardware may write results. Because the DATA packets and the RESULTS packets may be communicated in a linked-list manner by way of the header data packets, the physical location of the packets in the flash memory module does not have to be in the same order as execution. In other words, the interleaved logical image may be organized as depicted in FIG. 6, and the physical image may be organized differently than the logical image. FIG. 7 provides a schematic of an example organization of an interleaved physical image. As such, in accordance with an aspect of the present disclosure, in the physical image all the RESULT and STATUS packets may be organized into a chunk 712 of memory (e.g., from R1 through S10). In that case, each header points to the corresponding DATA, RESULT and STATUS packet (as indicated by the straight arrows), and also points to the next Header packet—as indicated by the curved arrows (e.g., by identifying a location of the next header packet in the "Next Header address" field identified in Table 1). Since all the RESULT and STATUS packets are next to each other, in contrast to conventional systems, a chunk of the memory 131 may be compared to determine a PASS or FAIL, which may be less complicated and faster than reading them from various locations.

The Device A 110 and the Device B 120 may include one or more chiplets, which are tested using the same test data. Sometimes one or more chiplets may be tested in parallel. However, in other instances the test may be split into tests for smaller subsets of chiplets, such as when a power supply is unable to meet the power budget required to test larger quantities of chiplets in parallel. In contrast to conventional systems, which may store and retrieve a separate copy of test data for each chiplet or for each split, some embodiments uses multiple header packets pointing to the same DATA packet across multiple chiplets. Again, this linking is enabled using the header packet structure with data fields identified in Table 1, and a "chiplet ID" field in the HEADER packet indicates in which chiplet(s) the IST is being run. As a result, smaller amounts of test data are stored in the memory 131, which may reduce memory usage.

Figure 8:
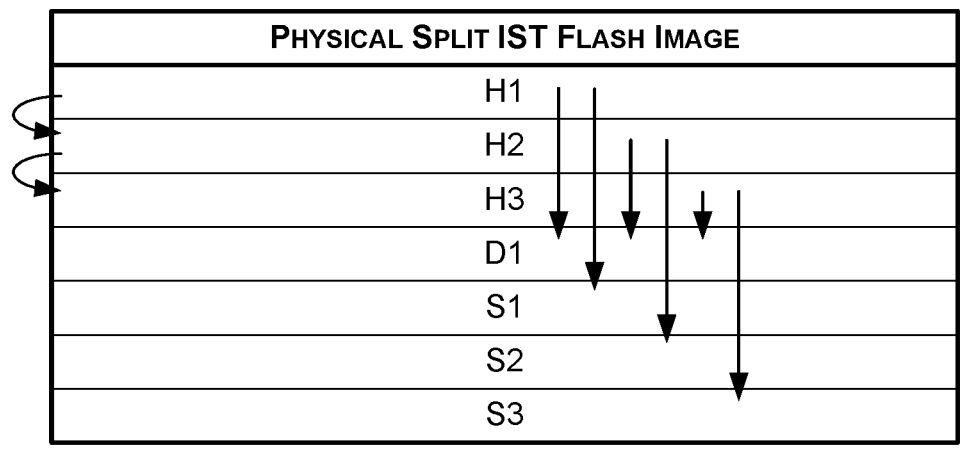
FIG. 8 depicts a table representing a logical image of memory and a table representing a physical image of memory, both storing packets exchanged with chiplets that use a same D1 data to run BIST, in accordance with some embodiments of the present disclosure.

Referring now to FIG. 8, a logical image 810 of the split IST flash image illustrates the logical flow of IST, which is run in three splits through the header packets H1, H2 and H3. All the splits may use the same DATA packet (e.g., D1) and, in contrast to conventional systems where multiple copies of the DATA packet may be stored for each chiplet, embodiments of the present disclosure may reduce the amount of the memory 131 used to store the DATA packet by linking to a single copy of the DATA packet. For instance, as illustrated by the physical image 812, each header packet is structured to have both a pointer or a link for the DATA packet and a pointer or link to the next header packet. As such, the image can be organized as a physical split IST flash image to achieve the flow in the logical split IST flash image. This way, the DATA packet may be stored at one location, but multiple header packets may point to it—thereby reducing the (flash) memory usage.

The chiplet ID field may be used in various manners. In one aspect of the disclosure, the chiplet ID includes one bit per chiplet (as indicated in Table 1). For example, if a device includes three chiplets (e.g., g0, g1 and g2), then the chiplet ID field may have its three least significant bits (LSB) bits matching to these three chiplets (all other bits are not used). The Header packets may include H1 with chiplet ID "001" to target chip g0; H2 with chiplet ID "010" to target chip g1; and H3 with chiplet ID "100" to target g2. However, in a split-image mode, one image may be used by broadcasting the commonly used DATA packet to all three chiplets. As such, an aspect of the present disclosure includes setting the chiplet ID to "111."

In another aspect of the disclosure, the Device A 110 and/or the Device B 120 may include different SKU configurations (e.g., provided by the manufacturer depending upon on customer requirements). Different SKU configurations may need different test data, and conventional testing systems may not provide a mechanism capable of using one external image (e.g., from flash source) to cater to different SKU configurations. In contrast, in at least one embodiments of the present disclosure, the stored test data may include a superset of all SKU configurations in the flash memory module and the right test data for a SKU combination of the devices A and B may be selected (e.g., using hardware). For instance, in some embodiments, a SKU packet may be communicated before the first header packet, and the SKU packet may include information among its data fields that is usable to determine whether the one or more devices are presently configured according to the SKU. That is, there may be one SKU packet for each SKU combination of the Device A 110 and the Device B 120. Each SKU packet may contain a SKU ID for both the devices and the SKU ID may be determined by a set of fuses on the respective chip. These are a couple examples of the information fields and data that might be included in a SKU packet and Table 2 (below) provides additional examples.

TABLE 2

SKU Packet Information Fields

| Field name | Description |
| --- | --- |
| Device A SKU ID | Indicates one of Device A SKU IDs for which this SKU packet belongs to. |
| Device B SKU ID | Indicates one of Device B SKU IDs for which this SKU packet belongs to. |
| Next SKU Packet Address | If any of "Device A SKU ID" or "DEVICE B SKU ID" is not matching with the SKU the devices belong to, then the next SKU packet is fetched from this address |
| First Header Packet Address | If both the SKU IDS match with the respective device, then the next packet is fetched from this address |

TABLE 2-continued

SKU Packet Information Fields

| Field name | Description |
|---|---|
| Is Last SKU Packet? | Indicates if this is the last SKU packet (e.g., single bit 1 or 0). If the SKU match is not found in any of the SKU packets, then IST master sequencer triggers shutdown of both the devices. |

Figure 9:
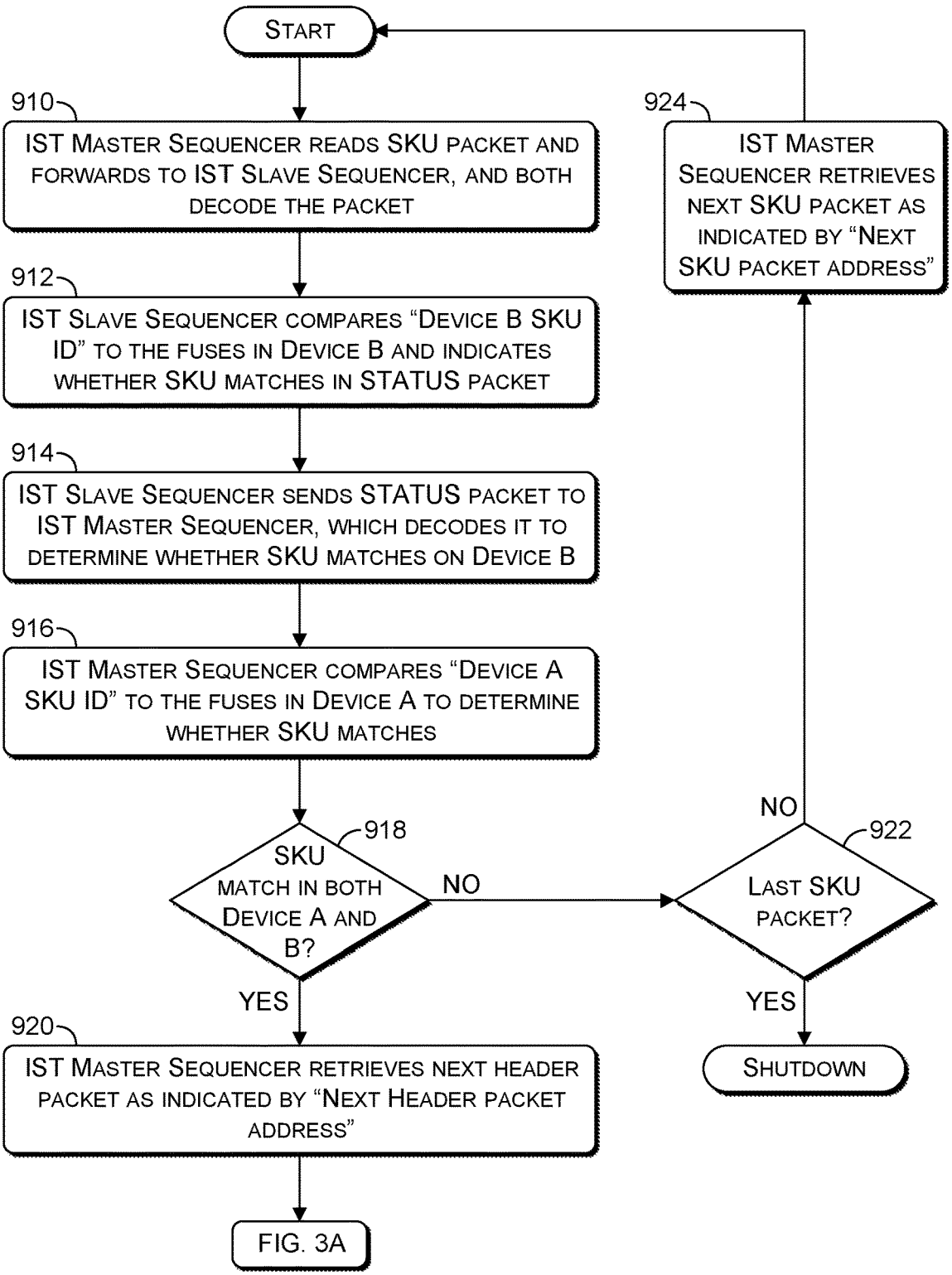
FIG. 9 depicts a flow diagram showing a process for an IST master sequencer and an IST slave sequencer when receiving a stock keeping unit (SKU) data packet, in accordance with some embodiments of the present disclosure.

Once a software trigger initiates IST, the IST master sequencer 146 and the IST slave sequencer 148 may execute a series of operations based on the SKU packets received. For example, FIG. 9 illustrates a flow diagram including a series of operations of the IST master sequencer 146 and the IST slave sequencer 148. Both the IST master sequencer 146 and the IST slave sequencer 148 may be programmed with software to execute the respective operations in FIG. 9. Once Device A 110 enters IST mode, the IST master sequencer 146 reads the first SKU data packet from the memory 131, which may be provided to the IST master sequencer 146 by software. Then, once Device B 120 enters IST mode, the IST slave sequencer 148 runs in parallel to the IST master sequencer 146.

Figure 10:
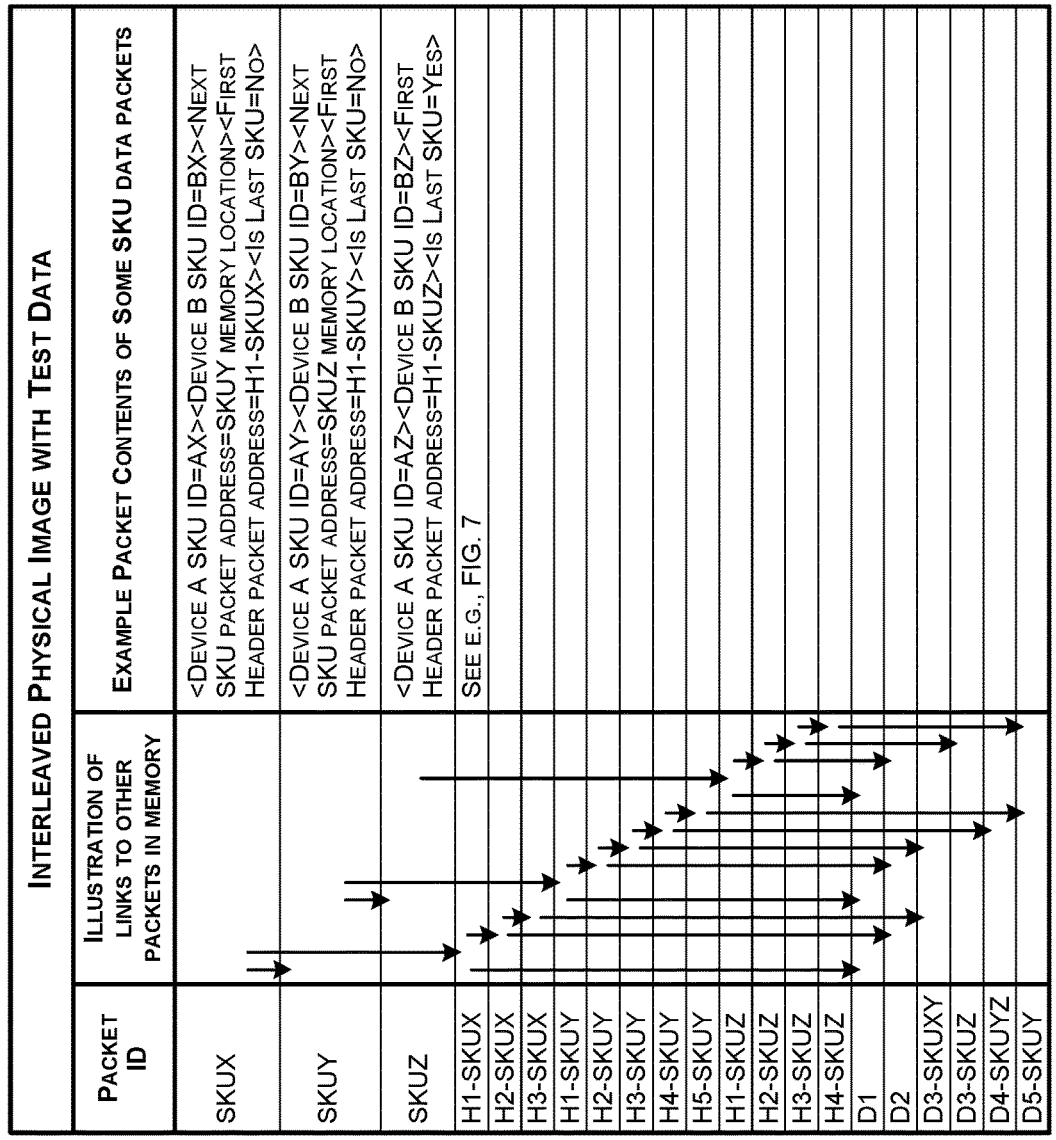
FIG. 10 depicts a table representing a logical image of memory storing a superset of SKU configurations, in accordance with some embodiments of the present disclosure.

An example showing various packets is depicted in FIG. 10, which includes three SKU packets SKU X, SKU Y, and SKU Z. Each SKU packet may include various data identified in Table 2, such as a Device A SKU ID, a Device B SKU ID, a Next SKU packet address, a First Header packet address, and an indication of whether this is the last SKU packet. As such, referring to FIG. 9, at process 910 the IST master sequencer 146 may first read and decode the SKU X packet, and forward the SKU X packet to the IST slave sequencer 148, which also decodes the SKU X packet. At 912 the IST slave sequencer compares the "Device B SKU ID" to the fuses in Device B to determine whether they match. In addition, the IST slave sequencer indicates whether the SKU matches in a STATUS packet. Process 914 includes the IST slave sequencer 148 sending the STATUS packet to the IST master sequencer 146, which decodes it to determine whether the SKU matches on Device B 120. At process 916, the IST master sequencer 146 compares the Device A SKU ID to the fuses in Device A to determine whether Device A matches the SKU, and at 918, if both devices match the SKU, then the IST master sequencer 146 may retrieve (920) the next header packet from the address identified in the "Next Header packet address" of the SKU packet. For example, in FIG. 10, an arrow connects the SKUX packet to the H1-SKUX packet, which represents the linking by specifying the header address in the SKU packet. Alternatively, at 918, if both SKUs do not match, then at process 922 the IST master sequencer 146 looks at the "Is Last SKU Packet?" information field to determine whether it should retrieve another SKU. If it is not the last SKU packet, then the IST master sequencer may retrieve 924 the next SKU packet as indicated in the "Next SKU Packet Address" field. For example, as depicted in FIG. 10, the SKUX packet includes a direction to the SKUY packet, which represents the linking of SKU packets by specifying the address of the next SKU packet. Once SKUY is retrieved, the flow of FIG. 9 may be restarted.

Although FIG. 9 depicts one flow in which the IST master sequencer 146 determines whether the SKU of Device A matches at process 916, in an alternative embodiment, processes 916 and 918 may be skipped when the IST master sequencer 146 determines that Device B does not match. In that instance (not explicitly depicted in FIG. 9), the IST master sequencer 146 may proceed from process 914 to process 922.

As depicted in FIG. 10, each header packet points to the corresponding DATA, RESULT, STATUS packets. In addition, because some of the DATA packets can be common across SKUs, the linking technique described above with respect to FIG. 8 may be implemented. That is, in FIG. 10, H1-SKUX, H1-SKUY, and H1-SKUZ can point to the same DATA packet D1. This is possible because the HEADER has the pointers to DATA packet and also the "next HEADER address." In this example provided by FIGS. 10, D1 and D2 are being shared across all SKUS, and as such, the H1 of each SKU points to D1 and D2. D3-SKUXY is shared for SKUX and SKUY, as indicated by the arrows from H2-SKUX and H2-SKUY, while D3-SKUZ is used by just SKUZ. By linking the DATA packets to the HEADER packets in this manner, the present disclosure may reduce memory usage, since fewer copies of the DATA packets are stored. Moreover, all SKUS can share the RESULT and STATUS packet space in the memory because each HEADER packet has "RESULT and STATUS packet address" and only one SKU is valid anytime.

Various aspects of the present disclosure have been described with respect to FIGS. 1 through 10. Some additional aspects will now be described, and reference may be made back to FIGS. 1 through 10 as examples. One aspect of the present disclosure includes a system having a storage device (e.g., the memory 131 with data 144); a data bus (e.g., the link 142, such as a PCIe link); and an integrated chip (IC) device (e.g., the Device A 110 or the Device B 120) communicatively coupled to the storage device by the bus. The IC device is scheduled to perform built-in-self-testing (BIST) using a data packet (e.g., HEADER data packet), and the data packet includes a device identifier (ID) field (e.g., "Device A or B" in Table 1 indicates for which device the packet is intended); a packet type field (e.g., "Packet Type" in Table 1 indicating JTAG, LBIST, or WAIT); and/or a last packet field (e.g., "Is Last Header" in Table 1 indicating whether this is the last HEADER packet). The device ID field includes first data representative of a device identifier of a device, wherein the device is scheduled to execute BIST and is connected to a storage device by a bus. For example, the device ID field might include some data that represents an identifier of Device A 110 or Device B 120 that are connected to the memory 131 by way of a link (e.g., PCIe link). In addition, the packet type field may include second data representative of an indication either that the data packet includes a data packet address identifying a location in the storage device at which BIST test data is stored or that the data packet includes a quantity enumerating a number of cycles the device is scheduled to pause from accessing the bus. For example, if the second data of the packet type field indicates "JTAG," this signals that the HEADER data packet may also include an address of the memory 131 at which BIST test data is stored (e.g., in the "Data Packet Address" of Table 1). Alternatively, if the second data of the packet type field indicates "WAIT," this signals that the HEADER data packet includes a quantity in the "Wait Cycles" data field, and the quantity enumerates a number of cycles the device (e.g., Device A or B depending on the Device ID) is scheduled to pause from accessing the bus. This pause permits the bus to be accessed by the other device running BIST concurrently. Furthermore, the last packet field includes third data representative of an indication of whether the data packet is a last packet programmed for BIST. For example, the third data may include a bit (e.g., 0 or 1) indicating whether the HEADER data packet is the last. If the third data indicates that the HEADER data packet is not the last, then an IST sequencer may retrieve the next HEADER data packet using data provided in the "Next Header address" field. This linking permits scheduling of subsequent BIST operations to be run in parallel.

Another aspect of the present disclosure includes an integrated circuit comprising a first device (e.g., the Device A 110) scheduled to execute a first BIST; a second device (e.g., the Device B 120) scheduled to execute a second BIST; and/or a storage device (e.g., memory 131). The memory stores a first header data packet (e.g., H1 in FIG. 6) and a first set of BIST test data (e.g., D1 in FIG. 6), and the first header data packet includes first data representative of an identifier of the first device (e.g., Device A or B in Table 1). The memory also stores a second header data packet (e.g., H2 in FIG. 6) including second data (e.g., Wait Cycles in Table 1) representative of a number of cycles the first device is scheduled to pause from accessing the storage device while executing the first set of BIST test data. The memory also stores a third header data packet (e.g., H3 in FIG. 6) and a second set of BIST test data (e.g., D2 in FIG. 6), wherein the third header data packet includes third data representative of an identifier of the second device (e.g., Device A or B in Table 1). In a logical image of the memory, these HEADER packets may be interleaved with the DATA packets to facilitate concurrently testing Device A and Device B. In addition, in the physical image of the memory, the DATA packets may be stored proximately in a group, and the HEADER packets may be stored proximately in a separate group.

The integrated circuit might include additional elements. For example, the memory might store a fourth header data packet (e.g., H4 in FIG. 6) including fourth data representative of a number of cycles the second device is scheduled to pause from accessing the storage device while executing the second set of BIST test data (e.g., Wait Cycles in Table 1). In addition the memory may include a fifth header data packet (e.g., H5 of FIG. 6) including fifth data representative of a first location in the storage device to which a set of test results generated from the first set of BIST test data is to be written (e.g., Test Results Address in Table 1). The memory may also store a sixth header data packet (e.g., H6 in FIG. 6) including sixth data representative of a second location in the storage device to which a set of test results generated from the second set of BIST test data is to be written (e.g., Test Results Address in Table 1). In the physical image of the memory, the first location and the second location may be proximate to one another (e.g., next to one another), which may permit test results to be read more efficiently to determine a PASS or FAIL, as opposed to other testing systems in which the first and second locations may be more spread apart.

Another aspect of the present disclosure includes an integrated circuit comprising a device (e.g., the Device A 110 or the Device B 120) to execute BIST and a storage device (e.g., memory 131). The storage device stores a test data packet including BIST test data (e.g., D1 in FIG. 8). In addition, the storage device stores a first header data packet (e.g. H1 in FIG. 8) associated with a first execution of the BIST (e.g., on a first chiplet) and including first data representative of an address of the storage device at which the BIST test data is stored (e.g., "Data Packet Address" of Table 1 pointing to D1 in FIG. 8). The storage device also stores a second header data packet (e.g., H2 in FIG. 8) associated with a second execution of the BIST (e.g., on a second chiplet) and including second data representative of the address (e.g., "Data Packet Address" of Table 1 pointing to D1 in FIG. 8). In this integrated circuit, storage usage may be reduced since the BIST test data is stored once at the location and is pointed to by the headers of separate chiplets.

In a further aspect, the integrated circuit may also include a first SKU packet (e.g., SKUX in FIG. 10) and a second SKU packet (e.g., SKUY in FIG. 10. The first SKU packet includes third data representative of an identifier of a first SKU configuration (e.g., Device A SKU ID or Device B SKU ID in Table 2) and fourth data representative of a first header address (e.g., First Header packet address in Table 2) identifying an address in the storage device at which the first header data packet is stored (e.g., H1-SKUX in FIG. 10). The second SKU packet includes fifth data representative of an identifier of a second SKU configuration (e.g., Device A SKU ID or Device B SKU ID in Table 2) and sixth data representative of a second header address (e.g., First Header packet address in Table 2) identifying an address in the storage device at which the second header data packet (e.g., H1-SKUY in FIG. 10) is stored. In a further aspect, the first header data packet (e.g., H1-SKUX in FIG. 10) and the second header data packet (e.g., H1-SKUY in FIG. 10) include data representative of a data packet address (e.g., Data Packet Address in Table 1) identifying an address in the storage device at which BIST test data (e.g., D1 in FIG. 10) is stored, the BIST test data applying to the first SKU configuration and the second SKU configuration (e.g., as indicated in FIG. 10 by one arrow pointing from the H1-SKUX to D1 and another arrow pointing from the H1-SKUY to D1).

In another embodiment, the present disclosure includes a method. The method includes receiving (e.g., 310 of FIG. 3A or 410 of FIG. 4) a first header data packet (e.g., H1 or H3 of FIG. 6) comprising first data representative of a first data packet address (e.g., Data Packet Address in Table 1), which identifies a first location in a storage device (e.g., memory 131) at which first built-in self-testing (BIST) test data is stored (e.g., D1 or D2 in FIG. 6), the first BIST test data for running a first BIST on a first IC device (e.g., the Device A 110 or the Device B 120) communicatively coupled to the storage device by a bus (e.g., the link 142). The first BIST test data is retrieved (e.g., 322 or 330 of FIG. 3A) from the first location in the storage device by accessing the bus. In addition, a test network of the first IC device is accessed (e.g., 322 of FIG. 3A or 420 of FIG. 4) to execute the first BIST using the first BIST test data. The method also includes receiving a second header data packet (e.g., H2 or H4 of FIG. 6) comprising second data representative of a quantity enumerating a number of cycles the first IC device is scheduled to pause from accessing the bus while the first BIST is executed. A wait counter is triggered (e.g., 319 of FIG. 3A or 417 of FIG. 4) to count for the number of cycles.

The method might include additional steps. For example, a third header data packet may be received that includes third data representative of a second data packet address, which identifies a second location in the storage device at which second BIST test data is stored, the second BIST test data for running a second BIST on a second IC device communicatively coupled to the storage device by the bus. While the first IC device is executing the first BIST and is paused from accessing the bus, the second BIST test data is retrieved. In another aspect, the first header data packet comprises third data representative of a second data packet address (e.g., Next Header Address in Table 1) identifying a second location in the storage device at which the second header data packet is stored, and the method further comprises using the second data packet address to retrieve the second header data packet. In a further embodiment, the first header data packet comprises third data representative of a plurality of chiplet identifiers of chiplets scheduled to receive a broadcast of the first BIST test data, and the method further comprises running BIST on each chiplet of the chiplets using the first BIST test data retrieved from the location in the storage device (e.g., FIG. 8 illustrating multiple headers linked to the same D1). In yet another aspect, a third header data packet is received including third data representative of a device identifier (e.g., Device A or B in Table 1) of the IC device, and the method includes determining that the wait counter is active (e.g., 314 in FIG. 3A or 412 of FIG. 4). When the wait counter is active, reading the third header data packet is paused (e.g., 315 of FIG. 3A or 413 of FIG. 4) until the number of cycles has expired. In another embodiment, the method includes receiving a third header data packet (e.g., H5 in FIG. 6) including third data representative of a second location in the storage device (e.g., e.g., Test Results Address in Table 1) to which a first set of test results (e.g., R1 in FIG. 6) generated from the first BIST test data is to be written, and receiving a fourth header data packet (e.g., H6 in FIG. 6) including fourth data representative of a second location in the storage device (e.g., e.g., Test Results Address in Table 1) to which a second set of test results (e.g., R2 in FIG. 6) generated from a second BIST test data is to be written. The first set of test results are written (e.g., 338 in FIG. 3B) to the second location in a memory image, and the second set of test results are written (e.g., 340 in FIG. 3B) to the third location in a memory image. The second location and the third location include no other data packets interleaving therebetween in the memory image (e.g., R1 and R2 of grouping 712 in FIG. 7). The method might also include receiving a stock keeping unit (SKU) data packet (e.g., 910 of FIG. 9) including third data representative of a SKU configuration (e.g., SKU ID in Table 2) and including fourth data representative of a second data packet address (e.g., First Header Packet Address in Table 2) identifying a second location in the storage device at which the first header data packet is stored. After determining that the first IC device matches the SKU configuration (e.g., 916 in FIG. 9), the first header data packet is retrieved (e.g., 920 in FIG. 9) from the second location using the second data packet address.

Various flow diagrams are described in this disclosure (e.g., FIGS. 3A, 3B, 4, and 9), each block of described herein, may comprise a computing process that may be performed using any combination of hardware, firmware, and/or software. For instance, various functions may be carried out by a processor executing instructions stored in memory. The methods represented by the flow diagrams may also be embodied as computer-usable instructions stored on computer storage media. The methods may be provided by a standalone application, a service or hosted service (standalone or in combination with another hosted service), or a plug-in to another product, to name a few. In addition, methods are described, by way of example, with respect to the system of FIGS. 1 and 2. However, these methods may additionally or alternatively be executed by any one system, or any combination of systems, including, but not limited to, those described herein.

The disclosure may be described in the general context of computer code or machine-useable instructions, including computer-executable instructions such as program modules, being executed by a computer or other machine, such as a personal data assistant or other handheld device. Generally, program modules including routines, programs, objects, components, data structures, etc., refer to code that perform particular tasks or implement particular abstract data types. The disclosure may be practiced in a variety of system configurations, including handheld devices, consumer electronics, general-purpose computers, more specialty computing devices, etc. The disclosure may also be practiced in distributed computing environments where tasks are performed by remote-processing devices that are linked through a communications network.

As used herein, a recitation of "and/or" with respect to two or more elements should be interpreted to mean only one element, or a combination of elements. For example, "element A, element B, and/or element C" may include only element A, only element B, only element C, element A and element B, element A and element C, element B and element C, or elements A, B, and C. In addition, "at least one of element A or element B" may include at least one of element A, at least one of element B, or at least one of element A and at least one of element B. Further, "at least one of element A and element B" may include at least one of element A, at least one of element B, or at least one of element A and at least one of element B.

The subject matter of the present disclosure is described with specificity herein to meet statutory requirements. However, the description itself is not intended to limit the scope of this disclosure. Rather, the inventors have contemplated that the claimed subject matter may also be embodied in other ways, to include different processes or combinations of processes similar to the ones described in this document, in conjunction with other present or future technologies. Moreover, although the terms "step," "process," and/or "block" may be used herein to connote different elements of methods employed, the terms should not be interpreted as implying any particular order among or between various processes herein disclosed unless and except when the order of individual processes is explicitly described.

What is claimed is:

1. A system comprising:
    a storage device;
    a data bus;
    an integrated chip (IC) device communicatively coupled to the storage device by the data bus,
    wherein the IC device is scheduled to perform built-in self-testing (BIST) using a data packet comprising:
        a device identifier (ID) field including first data representative of a device identifier of the IC device;
        a packet type field including second data indicating the data packet includes at least one of: a data packet address identifying a location in the storage device at which BIST test data is stored, or a quantity enumerating a number of cycles the IC device is scheduled to pause from accessing the data bus; and
        a last packet field including third data representative of an indication of whether the data packet is a last packet programmed for a BIST session.

2. The system of claim 1, wherein the data packet further comprises a test data address field including fourth data representative of the data packet address identifying the location in the storage device.

3. The system of claim 1, wherein the data packet further comprises a test data size field including fourth data representative of a size of the BIST test data.

4. The system of claim 1, wherein the data packet further comprises a next packet address field including fourth data representative of an address in the storage device at which another data packet is retrievable.

5. The system of claim 1, wherein the data packet further comprises a wait cycle field including fourth data representative of the quantity enumerating the number of cycles.

6. The system of claim 1, wherein the data packet further comprises a test results address field including fourth data representative of an address in the storage device to which test results are writable.

7. The system of claim 1, wherein the data packet further comprises a test results size field including fourth data representative of a size of test results generated by the device based on the BIST test data.

8. The system of claim 1, wherein the data packet further comprises a test status address field including fourth data representative of an address in the storage device to which a test status is writable.

9. The system of claim 1, wherein the data packet further comprises a chiplet ID field including fourth data representative of a plurality of chiplet identifiers of chiplets scheduled to receive a broadcast of the BIST test data.

10. An integrated circuit comprising:
a first device scheduled to execute a first built-in self-test (BIST);
a second device scheduled to execute a second BIST; and
a storage device comprising:
a first header data packet and a first set of BIST test data, wherein the first header data packet includes first data representative of an identifier of the first device;
a second header data packet including second data representative of a number of cycles the first device is scheduled to pause from accessing the storage device while executing the first set of BIST test data; and
a third header data packet and a second set of BIST test data, wherein the third header data packet includes third data representative of an identifier of the second device.

11. The integrated circuit of claim 10,
wherein, in a logical memory image of the storage device, the first header data packet and the first set of BIST test data comprise a first data sequence, the second header data packet comprises a second data sequence, and the third header data packet and the second set of BIST test data comprise a third data sequence; and
wherein the second data sequence is interleaved between the first data sequence and the third data sequence.

12. The integrated circuit of claim 10, wherein, in a physical memory image of the storage device:
the first header data packet, the second header data packet, and the third header data packet are proximate to one another; and
the first set of BIST test data and the second set of BIST test data are proximate to one another.

13. The integrated circuit of claim 10, further comprising:
a fourth header data packet including fourth data representative of a number of cycles the second device is scheduled to pause from accessing the storage device while executing the second set of BIST test data;

a fifth header data packet including fifth data representative of a first location in the storage device to which a set of test results generated from the first set of BIST test data is to be written; and
a sixth header data packet including sixth data representative of a second location in the storage device to which a set of test results generated from the second set of BIST test data is to be written,
wherein, in a physical memory image of the storage device, the first location and the second location are proximate to one another.

14. The integrated circuit of claim 10, wherein the first device comprises a master sequencer and the second device comprises a slave sequencer, wherein a pause is issued by the master sequencer for the number of cycles while the first BIST is run, and wherein the slave sequencer retrieves the second set of BIST test data during the pause.

15. The integrated circuit of claim 10, wherein the first header data packet includes a data packet address identifying a location in the storage device at which the first set of BIST test data is stored.

16. A method comprising:
receiving a first header data packet comprising first data representative of a first data packet address, which identifies a first location in a storage device at which first built-in self-testing (BIST) test data is stored, the first BIST test data for running a first BIST on a first IC device communicatively coupled to the storage device by a bus;
retrieving the first BIST test data from the first location in the storage device by accessing the bus;
accessing a test network of the first IC device to execute the first BIST using the first BIST test data;
receiving a second header data packet comprising second data representative of a quantity enumerating a number of cycles the first IC device is scheduled to pause from accessing the bus while the first BIST is executed; and
triggering a wait counter to count for the number of cycles.

17. The method of claim 16, further comprising:
receiving a third header data packet comprising third data representative of a second data packet address, which identifies a second location in the storage device at which second BIST test data is stored, the second BIST test data for running a second BIST on a second IC device communicatively coupled to the storage device by the bus; and
while the first IC device is executing the first BIST and is paused from accessing the bus, retrieving the second BIST test data.

18. The method of claim 16, wherein the first header data packet comprises third data representative of a second data packet address identifying a second location in the storage device at which the second header data packet is stored; and
wherein the method further comprises using the second data packet address to retrieve the second header data packet.

19. The method of claim 16, wherein the first header data packet comprises third data representative of a plurality of chiplet identifiers of chiplets scheduled to receive a broadcast of the first BIST test data; and wherein the method further comprises running BIST on each chiplet of the chiplets using the first BIST test data retrieved from the location in the storage device.

20. The method of claim 16 further comprising:
receiving a third header data packet including third data representative of a device identifier of the IC device;
determining that the wait counter is active; and pausing reading the third header data packet until the number of cycles has expired.

21. The method of claim 16 further comprising:

receiving a third header data packet including third data representative of a second location in the storage device to which a first set of test results generated from the first BIST test data is to be written;

receiving a fourth header data packet including fourth data representative of a second location in the storage device to which a second set of test results generated from a second BIST test data is to be written; and writing the first set of test results to the second location in a memory image and the second set of test results to the third location in a memory image, the second location and the third location having no other data packets interleaving therebetween in the memory image.

22. The method of claim 16 further comprising:

receiving a stock keeping unit (SKU) data packet including third data representative of a SKU configuration and including fourth data representative of a second data packet address identifying a second location in the storage device at which the first header data packet is stored; and after determining that the first IC device matches the SKU configuration, retrieving the first header data packet from the second location using the second data packet address.

* * * * *